(12) United States Patent
Nemoto et al.

(10) Patent No.: US 8,502,345 B2
(45) Date of Patent: Aug. 6, 2013

(54) REVERSE-CONDUCTING INSULATED GATE BIPOLAR TRANSISTOR

(75) Inventors: Michio Nemoto, Matsumoto (JP); Souichi Yoshida, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 79 days.

(21) Appl. No.: 13/015,229

(22) Filed: Jan. 27, 2011

(65) Prior Publication Data
US 2011/0186965 A1 Aug. 4, 2011

(30) Foreign Application Priority Data
Jan. 29, 2010 (JP) .................................. 2010-017681

(51) Int. Cl.
*E21B 49/00* (2006.01)

(52) U.S. Cl.
USPC ........... 257/565; 257/368; 257/378; 257/288; 257/328; 257/E29.262

(58) Field of Classification Search
USPC .......................... 257/288, 378, 368, 565, 328
See application file for complete search history.

(56) References Cited

U.S. PATENT DOCUMENTS

| | | | | |
|---|---|---|---|---|
| 7,132,321 B2 * | 11/2006 | Kub et al. | | 438/172 |
| 7,635,892 B2 * | 12/2009 | Tokuda et al. | | 257/328 |
| 7,713,794 B2 * | 5/2010 | Iwamuro | | 438/140 |
| 7,812,427 B2 * | 10/2010 | Mauder et al. | | 257/653 |
| 2005/0045960 A1 | 3/2005 | Takahashi | | |
| 2007/0158680 A1 | 7/2007 | Ozeki et al. | | |
| 2008/0135870 A1 | 6/2008 | Okada et al. | | |
| 2010/0038707 A1 * | 2/2010 | Tokuda et al. | | 257/328 |

FOREIGN PATENT DOCUMENTS

| | | |
|---|---|---|
| JP | 4097416 B2 | 3/1992 |
| JP | 2827523 B2 | 11/1998 |
| JP | 2004-363328 A | 12/2004 |
| JP | 2005-101514 A | 4/2005 |
| JP | 2006-019556 A | 1/2006 |
| JP | 2006-093374 A | 4/2006 |
| JP | 2007-184486 A | 7/2007 |
| JP | 2008-042073 A | 2/2008 |
| JP | 2008-117881 A | 5/2008 |

* cited by examiner

*Primary Examiner* — Matthew Landau
*Assistant Examiner* — Edward Chin
(74) *Attorney, Agent, or Firm* — Rossi, Kimms & McDowell LLP

(57) ABSTRACT

Reverse-conducting insulated gate bipolar transistor in which IGBT region and FWD region are integrated into a single body in a semiconductor substrate with a common active region is disclosed. MOS gate structure is on a first major surface side. Rear surface side structure is in a second major surface side of the semiconductor substrate and includes a plurality of recessed parts vertical to the second major surface, which are repeated periodically along the second major surface. A plurality of protruding parts are interposed between the recessed parts. Rear surface side structure includes p type collector region on a bottom surface of the recessed part, n type first field stop region at a position deeper than the collector region, n type cathode region on the top surface of the protruding part, and n type second field stop region in the protruding part at a position deeper than the cathode region.

10 Claims, 6 Drawing Sheets

FIG. 5
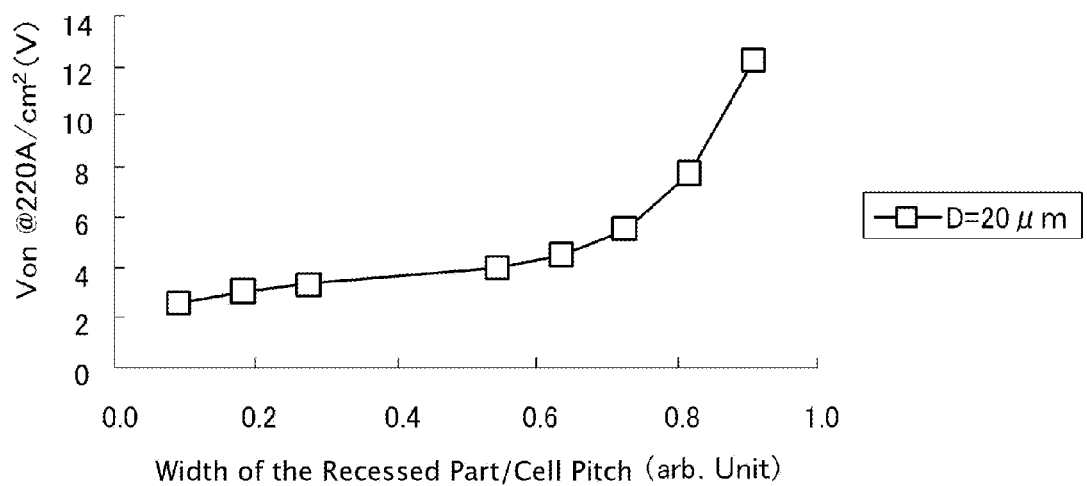
FIG. 6A
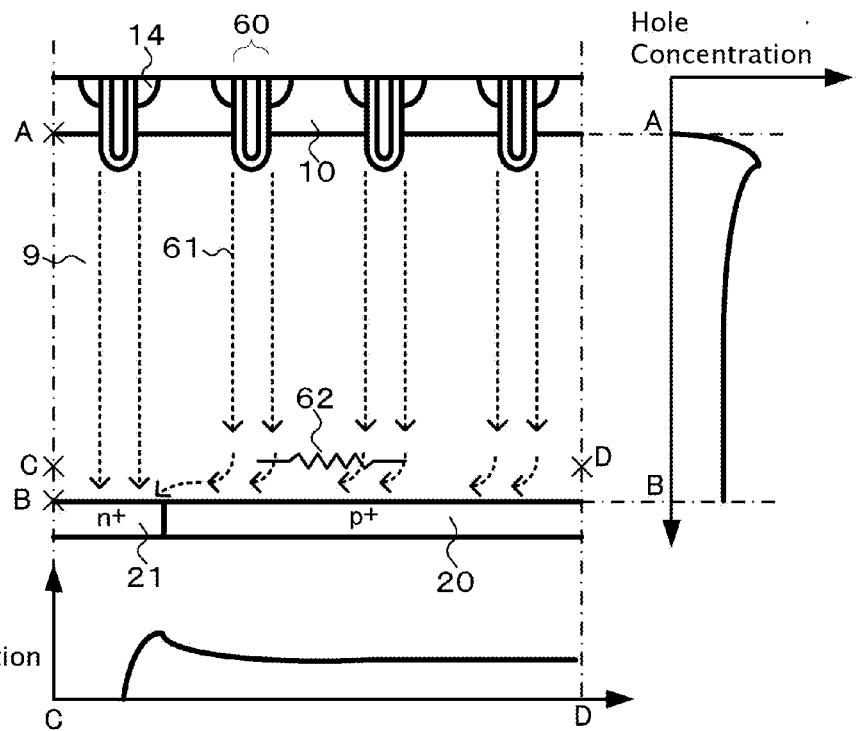
FIG. 6B
FIG. 6C
Hole Concentration

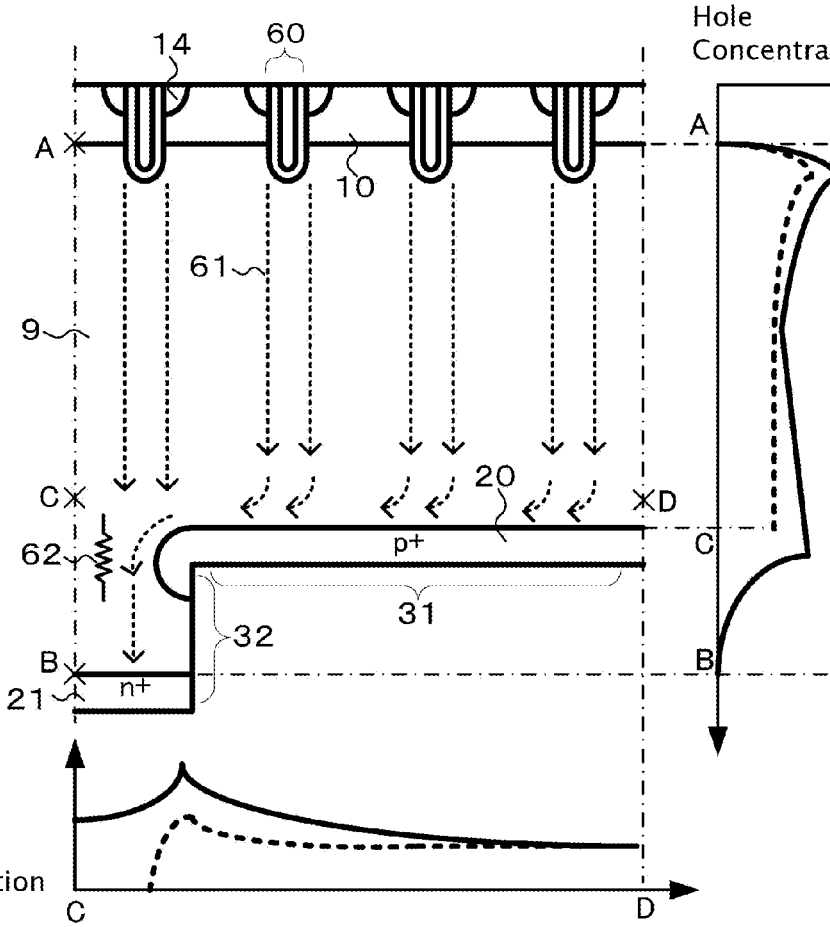

REVERSE-CONDUCTING INSULATED GATE BIPOLAR TRANSISTOR

BACKGROUND OF THE INVENTION

A. Field of the Invention

The present invention relates to a reverse-conducting insulated gate bipolar transistor (hereinafter also abbreviated to an RC-IGBT) that is provided with an insulated gate bipolar transistor (hereinafter also abbreviated to an IGBT) and a diode that is anti-parallel-connected to the IGBT, both disposed on one and the same semiconductor substrate.

B. Description of the Related Art

Performance improvement in power semiconductor devices is in progress in insulated gate bipolar transistors (IGBTs) and free-wheeling diodes (FWDs) for withstand voltage class of 600 V, 1,200 V, and 1,700 V. Those power semiconductor devices are used in high speed, high efficiency and power saving power conversion equipment including converters and inverters, and are indispensable for controlling rotating motors and servo motors. The power control apparatuses confront growing requests of the market for low losses (power saving), high speed, high efficiency, and environment-friendly characteristics. In order to address to these requests, the procedure of manufacturing an IGBT comprises a step of grinding the wafer from the rear surface side, which is an opposite side of the MOS gate side, to be as thin as possible while maintaining the necessary performance. The grinding step is carried out at a stage as late as possible in the wafer processing that has started with a conventionally employed thick wafer in consideration of preventing the wafer from cracking in the wafer processing. Moreover, a method of manufacturing a semiconductor device which provides low electric losses (low switching loss and low ON-state voltage drops) at a low cost has been developed, in which ion implantation of impurity elements from the ground rear surface side and a following activation treatment are conducted at an impurity concentration carefully selected in the design process. A main stream nowadays in development and manufacture of a power semiconductor device in particular is a manufacturing method for a semiconductor device with a thin semiconductor substrate providing a low loss performance at a low cost. For a low loss IGBT in particular, a step is essential for introducing and forming a so-called field stop region, a layer to stop expansion of a depletion layer before reaching a $p^+$ collector region, in the ground rear surface side. Further, for minimizing a chip size containing the IGBT and accompanying parts, reverse conducting IGBTs (RC-IGBTs) are being developed, the RC-IGBT incorporating an IGBT and an anti-parallel-connected FWD together in one and the same semiconductor substrate.

Japanese Unexamined Patent Application Publication No. 2004-363328 (FIG. 1 in particular) discloses a type of RC-IGBT with a structure in which a semiconductor chip is divided into two regions on the chip surface, and a principal active region of an IGBT region and a principal active region of a FWD region are arranged side by side in the two divided regions. Japanese Unexamined Patent Application Publication No. 2005-101514 (FIG. 1 in particular) discloses an RC-IGBT of a collector-shorted type in which the front surface region comprises solely a MOS gate region having a surface pattern similar to an ordinary IGBT, and the rear surface region comprises both an $n^+$ type cathode region for a FWD region and a $p^+$ type collector region for an IGBT region arranged side by side. In the arrangement for anti-parallel connection of the IGBT and the FWD, chip area is saved by sharing an edge termination structure at the outer periphery of the chip. This structure provides a relatively large area reduction effect of about 20% when employed in devices for a small current ratings (not larger than 20 A) since a proportion of an area occupied by the edge termination structure is relatively large.

Japanese Patent No. 4097416 (FIG. 1 in particular) and Japanese Unexamined Patent Application Publication No. 2008-042073 (FIG. 2 in particular) also disclose RC-IGBTs of a so-called collector-shorted type as well as Japanese Unexamined Patent Application Publication No. 2005-101514. In a collector-shorted type IGBT having an $n^+$ cathode region and a $p^+$ collector region together in the collector region side in the rear surface side, as compared with an IGBT having solely a $p^+$ collector region, electrons injected from the MOS gate structure in the gate ON state drain easily towards the $n^+$ cathode region of the FWD region and barely accumulate around the pn junction surface. As a result, an electric potential of the $p^+$ collector region hardly exceeds the built-in voltage. Consequently, in order to inject positive holes from the $p^+$ collector region in an IGBT of a collector-shorted type and perform conductivity modulation in a drift layer of the IGBT, some means needs to be devised in which a voltage drop due to the electron current running along the junction surface exceeds the built-in voltage (about 0.8 V) at the pn junction in the process of passing-through of the electrons in the vicinity of the $p^+$ collector region towards the $n^+$ cathode region. This phenomenon is called a latching up phenomenon. Further, when a high impurity concentration $n^+$ region such as a field stop region is formed, the electrons injected from the MOS gate runs towards the $n^+$ cathode region via this field stop region. Consequently, the voltage drop becomes extremely small especially around the junction surface, resulting in little possibility of latching up. (The voltage drop is a wording when the electron flow is considered as current of electricity, and the direction of flow of the electrons is opposite to the direction of flow of electric current.) Since a large magnitude of electron current is necessary to attain a voltage drop value around the junction surface required by the latching up, a "snap-back" occurs in the I-V waveform in the ON state causing a difficult condition for turning the IGBT region ON (or a difficult condition for latching up). Japanese Unexamined Patent Application Publication No. 2007-184486 (FIG. 4 in particular) discloses a method for easy latching up in which trenches are formed from a surface of a $p^+$ collector region in the rear surface side to a relatively deep position in the n-type layer to physically shield the $n^+$ cathode region partly, thereby increasing the electric resistance along direction of the junction surface, thus facilitating the latching up.

In a conventional RC-IGBT and a collector-shorted type IGBT, the latching up phenomenon described above is indispensable for achieving the conductivity modulation in a drift layer. Nevertheless, the latching up is not easy to achieve and a snap-back phenomenon is apt to occur caused by the existence of an $n^+$ cathode region in a $p^+$ collector region side, in comparison with an ordinary IGBT that is not a reverse-conducting type or a collector-shorted type. On the other hand, in order to achieve low switching loss and small current conduction loss, a field stop region with a high impurity concentration (hereinafter referred to as an $n^+$ FS region) needs to be provided at the $p^+$ collector region side in the n drift layer. However, the $n^+$ FS region has a high impurity concentration and a low resistivity. Consequently, the $n^+$ FS region exhibits a small voltage drop function that would be obtained by the electron injection, and becomes a factor that inhibits the latching up. Thus, an RC-IGBT for power conversion apparatuses has two inherent factors that inhibit latching up.

In the structure disclosed in Japanese Unexamined Patent Application Publication No. 2004-363328, the principal active region is divided into two portions: one for the FWD and the other for the IGBT. In this structure, a length (a width) of the p$^+$ collector region in the rear surface side of the IGBT region in the direction along the rear surface must be at least 100 μm in order to facilitate attaining a voltage drop value larger than the built-in voltage accompanied by electron current around the junction surface. In the case of provision of a low resistivity n$^+$ FS region in particular, this width must be a still larger value of 200 μm to 300 μm. On the other hand, a rate of area reduction obtained by integrating an IGBT and an FWD monolithically into one chip is yet a small value not larger than 20% in a device of small current rating of 20 A class. In addition, in consideration of the cost increase due to the increased number of steps and an additional material cost in the actual chip cost, a cost reduction rate obtained by the monolithic integration drops to a value of at most 10%. Consequently, in order to ensure a 30% reduction in chip cost, the area of a chip needs to be reduced by at least 40%. However, in a method to integrate an IGBT region and an FWD region monolithically into one chip, an integrated structure obtained by simply dividing the major active region of a semiconductor substrate into two regions as disclosed in Japanese Unexamined Patent Application Publication No. 2004-363328 is absolutely impossible to provide a cost reduction effect of 30%. Moreover, in the RC-IGBT structure provided with an n$^+$ FS region as described previously, in which a width of not smaller than 200 μm is ensured in the IGBT region itself, the FWD region needs an area corresponding to a width of about 100 μm, thus requiring an active region with a length (a width) of at least 300 μm. In the structure disclosed in Japanese Unexamined Patent Application Publication No. 2007-184486, in which a p$^+$ collector region (in the IGBT region) and an n$^+$ cathode region (in the FWD region) are separated from each other by a deep trench formed from the rear surface, an overall length of the IGBT region can be surely reduced. However, in a case of the length of the IGBT region shorter than 100 μm, the electrons injected from the MOS gate structure goes towards the FWD region in the middle of the n drift layer deeper than the bottom of the trench according to the electrostatic potential distribution, causing the latching up to occur hardly. Therefore, the RC-IGBT cannot benefit from the integration of the IGBT region and the FWD region into a single chip by means of the method disclosed in Japanese Unexamined Patent Application Publication No. 2007-184486, and the chip cost cannot be reduced yet.

The present invention is directed to overcoming or at least reducing the effects of one or more of the problems set forth above.

SUMMARY OF THE INVENTION

In view of the above-described issues, the present invention provides a reverse-conducting insulated gate bipolar transistor in which an IGBT region and an FWD region are integrated into a single body operating in one and the same active region and a chip cost is reduced by at least 30%.

In order to solve the above issues, the reverse-conducting insulated gate bipolar transistor of the invention comprises: a MOS gate structure on a first major surface of a first conductivity type semiconductor substrate, the MOS gate structure including, a second conductivity type base region, a first conductivity type emitter region selectively formed in the surface region of the second conductivity type base region, and a gate electrode disposed, via an insulation film, on a surface of the second conductivity type base region at a place between a surface of the emitter region and the first major surface of the first conductivity type semiconductor substrate; and a rear surface side structure in a second major surface side of the semiconductor substrate, the rear surface side structure including, a plurality of recessed parts in a vertical direction, the recessed parts being repeated along the second major surface in a necessary period, a plurality of protruding parts interposed between the recessed parts, a second conductivity type collector region on a bottom surface of the recessed part, a first field stop region of a first conductivity type at a position deeper than the collector region, a first conductivity type cathode region on a top surface of the protruding part, and, a second field stop region in the protruding part at a position deeper than the cathode region.

Preferably in the invention, the MOS gate structure comprises a trench extending vertically from a surface of the emitter region and passing through the second conductivity type base region, and the gate electrode is embedded in the trench opposing to the base region via the insulation film.

Preferably, a height D of the protruding part and a width La of the recessed part satisfies a relationship D≧5 La.

Favorably, a position of the maximum net doping concentration of the second field stop region is formed within the protruding part.

Preferably, a ratio of a width of the recessed part to a sum of the width of the recessed part and a width of the protruding part is not larger than 0.7.

According to the present invention, a reverse-conducting insulated gate bipolar transistor is provided in which an IGBT region and an FWD region are integrated into a single body operating in one and the same active region and a chip cost is reduced by at least 30%.

BRIEF DESCRIPTION OF THE DRAWINGS

The foregoing advantages and features of the invention will become apparent upon reference to the following detailed description and the accompanying drawings, of which:

FIGS. 1(a) and 1(b) show an essential part of an RC-IGBT of Embodiment 1 according to the present invention, in which FIG. 1(a) is a sectional view and FIG. 1(b) is a perspective view;

FIG. 5 shows a relationship between the ON-state voltage and a proportion of the recessed part in one cell pitch; and FIGS. 6(a) through 6(f) show a circumstance inside an RC-IGBT in the ON-state of the MOS gate, in which FIG. 6(a) is a sectional view of an essential part of a conventional RC-IGBT, FIGS. 6(b) and 6(c) are graphs showing hole concentration distribution in the RC-IGBT of FIG. 6(a) along the line from the point C to the point D and along the line from the point A to the point B, FIG. 6(d) is a sectional view of an essential part of an RC-IGBT of the invention, and FIGS. 6(e)

and 6(f) are graphs showing hole concentration distribution in the RC-IGBT of FIG. 6(d) along the line from the point C to the point D and along the line from the point A to the point B.

DETAILED DESCRIPTION OF SPECIFIC EMBODIMENTS

A preferred embodiment example, Embodiment 1, of a reverse-conducting insulated gate bipolar transistor (RC-IGBT) according to the present invention will be described in detail in the following with reference to accompanying drawings. The present invention shall not be limited to the following description of the embodiment example, Embodiment 1, as long as it does not exceed the spirit and scope of the present invention. Although the following description is made of the case where the first conductivity type is an n-type and the second conductivity type is a p-type, the effects of the invention can be obtained in the case of opposite polarities.

Embodiment 1

Figure 1A:
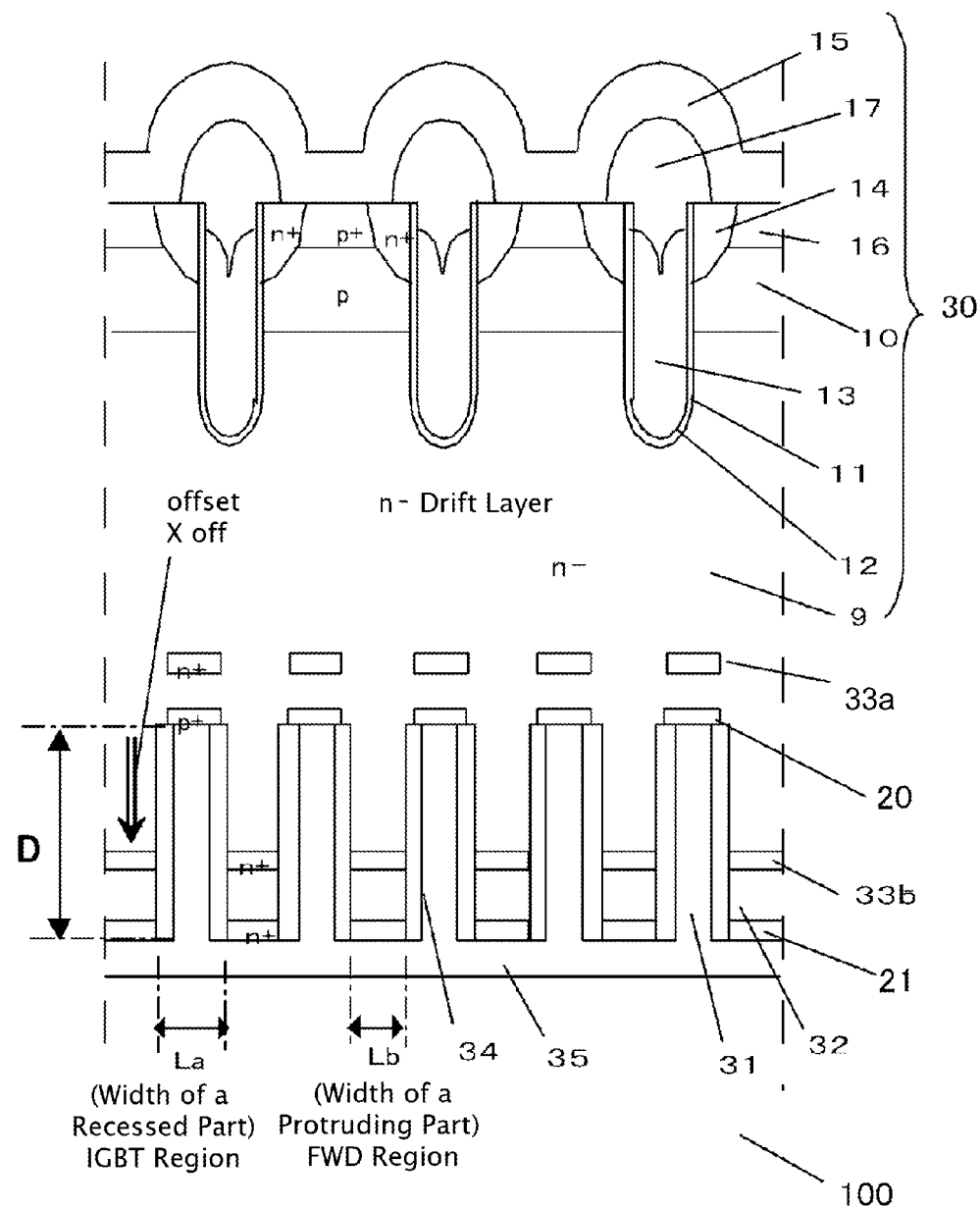
Figure 1B:
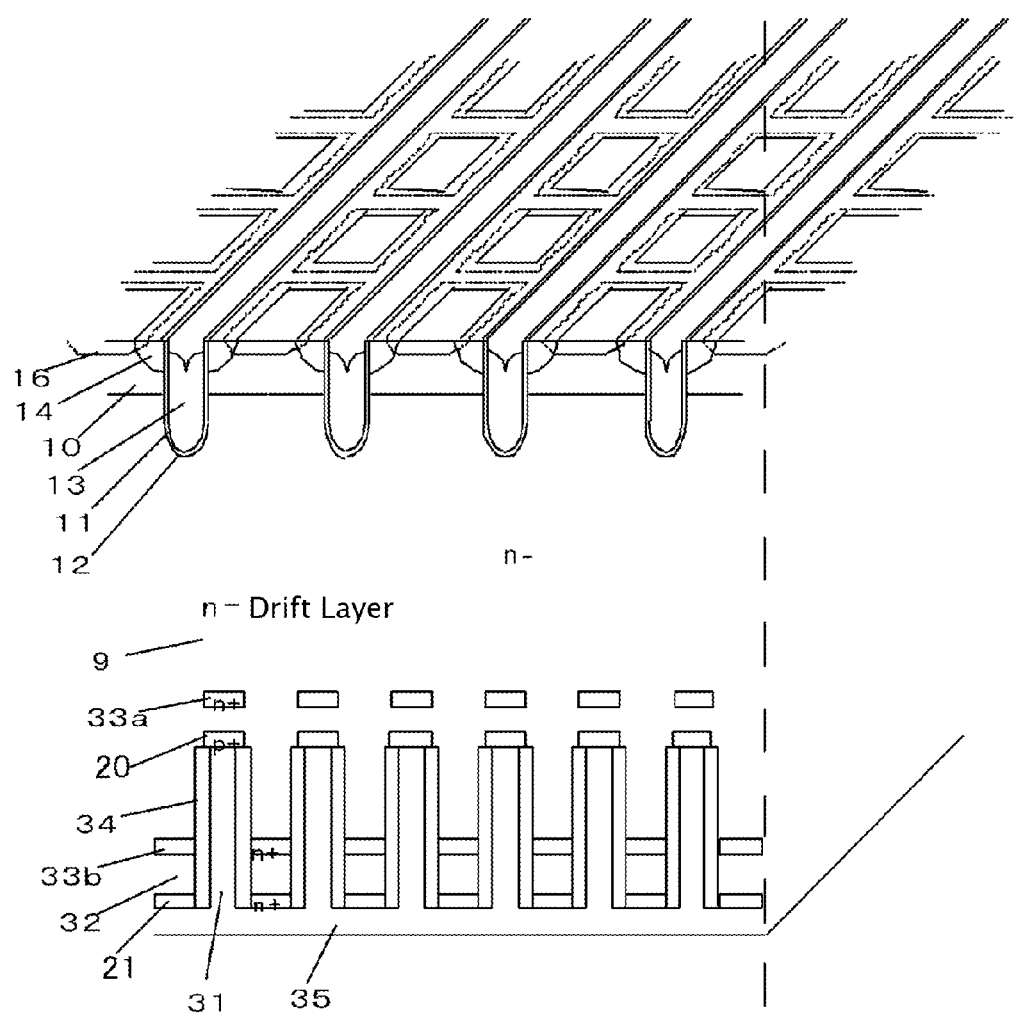

FIGS. 1(a) and 1(b) show an essential part of the RC-IGBT of Embodiment 1 according to the present invention, in which FIG. 1(a) is a sectional view and FIG. 1(b) is a perspective view. In FIG. 1(b), interlayer dielectric film 17 and emitter electrode 15 both depicted in FIG. 1(a) are omitted. The following describes in detail a structure and a manufacturing method of the RC-IGBT according to the invention.

In conventional RC-IGBTs, an FWD is incorporated into an ordinary FS-IGBT in an anti-parallel connection to the IGBT on a single semiconductor substrate. In an RC-IGBT of a conventional construction in general, the anti-parallel connected FWD comprises an anode layer that is a p base layer contained in a MOS gate structure in the front surface side of a semiconductor substrate and a cathode layer of $n^+$ cathode region that is formed by replacing a part of an ordinary $p^+$ collector region in the rear surface side.

In the RC-IGBT 100 of Embodiment 1 according to the present invention, the MOS gate structure 30 in the front surface side of the semiconductor substrate is similar to the one in a conventional trench IGBT as shown in FIGS. 1(a) and 1(b). In the rear surface side of the semiconductor substrate of an RC-IGBT of the invention, however, a plurality of unit steps is periodically distributed with fine patterns of protrusions and recesses such as a rectangular wave. $P^+$ collector region 20 is provided at the bottom of recessed part 31 of the step and $n^+$ cathode region 21 is provided on the top of protruding part 32 of the step. A period (or a pitch) of a set of one protruding part and one recessed part of the step is preferably not larger than 5 μm for the reason described afterwards. The RC-IGBT of the invention comprises IGBT region 40 extending in the thickness direction from $p^+$ collector region 20 in a part of the semiconductor substrate and FWD region 50 extending in the thickness direction from n+cathode region 21 in a part of the semiconductor substrate.

RC-IGBT 100 of Embodiment 1, when observed from the rear surface side, has a configuration consisting of multiple of IGBT regions 40 and FWD regions 50 that are divided cells with a small area and adjacent to each other. When observed from the front surface side, however, it is impossible to recognize the boundary between IGBT region 40 and FWD region 50 and a main active region is shared and common metal electrodes are deposited.

Each of IGBT regions 40 and FWD regions 50 in a configuration of divided cells is provided with first $n^+$ FS region 33a and second $n^+$ FS region 33b respectively at different positions from each other. The first $n^+$ FS region 33a of IGBT region 40 is disposed at a position in n-drift layer 9 deeper than the bottom of recessed part 31 of the step with a width approximately equal to that of $p^+$ collector region 20. The second $n^+$ FS region 33b of FWD region 50 is disposed at a position deeper than $n^+$ cathode region 21 but within protruding part 32 of the step.

The side wall of the protruding part of the step is preferably covered with insulation film 34. However, this insulation film 34 can be omitted while still retaining the effects of the invention.

Now, description will be made on a method of manufacturing the RC-IGBT 100 of Embodiment 1 according to the present invention, in a specific case of a rated voltage of 1,200 V, a rated current of 75 A, and a chip size of 8 mm×8 mm. A silicon semiconductor substrate (hereinafter "Si substrate") has a resistivity in the range from 40 to 80 Ωcm for 1,200 V class. A resistivity in the specific example of Embodiment 1 is 60 Ωcm. An n type FZ-Si substrate having this resistivity and a thickness of 650 μm and a diameter of 6 inches is used. Through a standard manufacturing procedure similar to the conventional one for trench MOS devices, formed are: p base layer 10, trench 11, gate oxide film 12, polysilicon gate electrode 13, $n^+$ emitter region 14, aluminum emitter electrode 15, $p^+$ contact region 16 and interlayer dielectric film 17.

After that, electron beam irradiation at a rate of 40 kGy is conducted from the side (from surface side) of MOS gate structure 30 to adjust a minority carrier lifetime. After once coating the front surface side with a resist film (not shown in the figure) for protecting the front surface side structure, the rear surface side of the Si substrate is ground to a thickness of 140 μm, followed by an etching process for removing a layer that is strained in the grinding process. Then, ion implantation is conducted from the rear surface side for forming second $n^+$ region 33b and $n^+$ cathode region 21 in the FWD region 50. First, hydrogen ions are implanted at an acceleration energy of 1 MeV and in a dose amount of $1\times10^{14}/cm^2$, and subsequently, phosphorus ions are implanted at an acceleration energy of 50 keV and in a dose amount of $1\times10^{15}/cm^2$.

Subsequently, a TEOS (tetraethylorthosilicate) film (not shown in the figure) 1 μm thick is formed on the rear surface side. After applying a resist material, a necessary patterning process (exposure and development) is conducted by means of photolithography. Then, anisotropic dry etching is conducted on the TEOS film in order to form the steps. The parts of the TEOS film exclusively at the openings are removed to form a pattern of openings with a width of 1 μm. Here, the exposure process can be carried out using a double side aligner in alignment with the front surface side, or using a single side aligner without alignment with the front surface side, the latter means produces no problem on operation of a resulted device.

After eliminating the resist film solely on the rear surface side, an anisotropic dry etching process is conducted from the rear surface side using the pattern of the TEOS film as a mask for etching the Si substrate. In this process, a multiple of recessed parts 31 of steps are formed in configuration of trenches at the openings on the TEOS film with a periodic pattern, while protruding parts 32 of the steps are formed at the places masked by the TEOS film and not etched.

After that, ion implantation is conducted from the rear surface side to form first $n^+$ FS region 33c and $p^+$ collector region 20 of the IGBT region. First, hydrogen ions are implanted at an acceleration energy of 1 MeV and in a dose amount of $1\times10^{14}/cm^2$, and boron ions are injected at an acceleration energy of 50 keV and in a dose amount of $1\times10^{14}/cm^2$.

Then, the TEOS film is removed by a dry etching process. Subsequently, laser light irradiation processes are conducted for activating the ion-implanted regions. The laser light irradiation process is conducted with YAG 2ω laser using two sets of laser equipment in double pulses with total energy density of 2 J/cm$^2$ and a delay time of 300 ns. First, the laser light is focused at the outermost position of rear surface side to activate n$^+$ cathode region 21, and then, in the same conditions except that the laser light is focused at the bottom of recessed part 31, p$^+$ collector region 20 is activated. After that, a TEOS film is formed again with a thickness of 0.01 μm. Then, an anisotropic dry etching process is conducted to remove the TEOS film exclusively on the top of protruding part 32 and on the bottom of recessed part 31 of the steps leaving the TEOS film on the side wall of the recessed part as insulation film 34.

Next, the resist film for protection on the front surface is removed as well, and then heat treatment is conducted at 380° C. for 1 hour. This heat treatment is conducted to recover the crystal defects due to hydrogen ion implantation to form a donor region (which is first n$^+$ FS region 33a) and n$^+$ cathode region 21. This heat treatment process may be omitted because the laser annealing using the YAG 2ω laser provides effects of recovering defects due to hydrogen ion implantation and formation of the donor region and n$^+$ cathode region 21. Finally, layers of Al/Ti/Ni/Au are formed on the rear surface with thicknesses of 1 μm/0.07 μm/1 μm/0.3 μm to form common electrode 35 functioning as a collector electrode and a cathode electrode.

Figure 2:
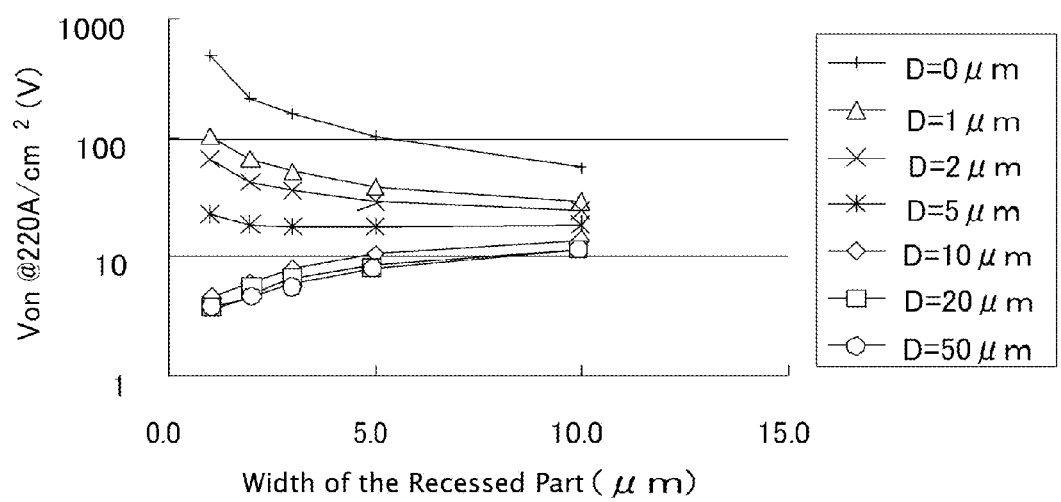
FIG. 2 shows a relationship between the ON-state voltage and the width of the recessed part of the steps formed in the rear surface side of an RC-IGBT of the present invention.

FIG. 2 shows a relationship between the ON-state voltage at a current density of 220 A/cm$^2$ measured at the room temperature and the width La (indicated in FIG. 1(a)) of the recessed part of the step formed in the rear surface side for the RC-IGBTs fabricated in Embodiment 1 and a conventional RC-IGBT which lacks the step in the rear surface side. The parameter is the depth D of the recessed part. Here, the width Lb (indicated in FIG. 1(a)) of the protruding part, the width Lb being an n$^+$ cathode region width, is fixed at 1 μm. The positions of first n$^+$ FS region 33a and second n$^+$ FS region 33b are at 5 μm from the outermost surface of p$^+$ collector region 20 side that is the recessed side and from the outermost surface of n$^+$ cathode region 21 side that is the protruding side, respectively. As shown in FIG. 2, in the case without a step (D=0 μm) as in the conventional structure, when the width of the p$^+$ collector region (corresponding to the width La of the recessed part) is expanded to 10.0 μm with the width of the n$^+$ cathode region (corresponding to the width Lb of the protruding part) fixed to 1 μm, the ON-state voltage decreases with expansion of the width of the recessed part. This dependence of ON-state voltage on the width La is the same tendency as the conventional. Here, the ON-state voltage is generally high because the width Lb of the n$^+$ cathode region is only a small value of 1 μm.

On the RC-IGBTs having the steps in the rear surface side according to the invention, on the other hand, it has been newly revealed that the ON-state voltage decreases with decrease of the recessed part width La if the depth D of the recessed part is more than 5 μm, as shown in FIG. 2. When the depth D becomes larger than 5 μm in particular, the recessed part width dependency of the ON-state voltage is reversed and, unexpectedly, it has been found that the ON-state voltage lowers with narrowing of the width La of the recessed part that is the width of the p$^+$ collector region 20. This means that although a p layer, p$^+$ collector region 20, and an n layer, first n$^+$ FS region 33a, are arranged in parallel, holes are injected from p$^+$ collector region 20 in a phenomenon that cannot be understood on the basis of a latching up phenomenon caused by voltage drop generated by lateral electron current along a pn junction surface as in a conventional device.

As described above, the ON-state voltage decreases with narrowing of the recessed part width La in the rear surface side structure comprising the steps including recessed part 31 that is deeper than 5 μm. A reason (or mechanism) for this dependency of the ON-state voltage can be considered as follows.

FIGS. 6(a) through 6(f) are schematic sectional views of IGBTs and graphs of hole concentration distribution illustrating a state in which the pn junction in the rear surface side latches up and excessive carriers have generated in the condition of MOS gate 60 ON. FIGS. 6(a) through 6(f) show a circumstance inside an RC-IGBT in the ON-state of the MOS gate, in which FIG. 6(a) is a sectional view of an essential part of a conventional RC-IGBT, FIGS. 6(b) and 6(c) are graphs showing hole concentration distribution in the RC-IGBT of FIG. 6(a) along the line from the point C to the point D and along the line from the point A to the point B, FIG. 6(d) is a sectional view of an essential part of an RC-IGBT of the invention, and FIGS. 6(e) and 6(f) are graphs showing hole concentration distribution in the RC-IGBT of FIG. 6(d) along the line from the point C to the point D and along the line from the point A to the point B.

In the case of a conventional RC-IGBT as shown in FIG. 6(a), electrons 61 injected from MOS gate 60 go around the vicinity of the junction surface of p$^+$ collector region 20 and run towards n$^+$ cathode region 21. In this electron current flow, a voltage drop is generated caused by resistance component 62 in n-drift layer 9. When the voltage drop value exceeds the built-in voltage of the pn junction, holes are injected. After reaching a steady state, the hole concentration distribution exhibits the profiles as shown in FIG. 6(b) and FIG. 6(c).

In the RC-IGBT according to the invention, steps are formed in the rear surface side. On the top of protruding part 32 of the step, n$^+$ cathode region 21 is formed; on the bottom of recessed part 31, p$^+$ collector region 20 is formed. Thus, n$^+$ cathode region 21 is made more distant from the MOS gate than p$^+$ collector region 20. Electrons 61 injected from MOS gate 60 not only flow in the vicinity of the junction surface of p$^+$ collector region 20 along the junction surface, but also flows around the corner of the bottom of recessed part 31 along the curved junction line of p$^+$ collector region 20 at the curved end of p$^+$ collector region 20 and go towards n$^+$ cathode region 21 of protruding part 32. As a result, a voltage drop caused by the electron current is generated along the path from n$^+$ cathode region 21 of protruding part 32 through the corner of the bottom of recessed part 31 towards p$^+$ collector region 21 at the side of protruding part 32. This voltage drop exceeds the built-in voltage (0.8V) of the pn junction much easily as compared with in the conventional RC-IGBT. The holes are injected according to the electric potential, from p$^+$ collector region 20 at the protruding part side towards protruding part 32 approximately right laterally. The position at which the latching up occurs (hereinafter referred to as "a latching up point") shifts from the flat junction surface on p$^+$ collector region 20 to the curved end place of the p$^+$ collector region. The holes are also injected from the end place of the next p$^+$ collector region 20 at the protruding part side, the next p$^+$ collector region 20 being disposed at the next recessed part 31 across the adjacent protruding part 32. The directions of hole injection from the both p$^+$ collector regions are in the right lateral direction but opposite to each other. Thus, the hole injection from both sides of the p$^+$ collector regions are reinforced (injection built-up effect). As a result, the hole concentration is more enhanced at protruding part 32 intervening between p$^+$ collector regions 20.

As a result of the shift of the latch-up point to the end place of p$^+$ collector region 20, the flat junction part of p$^+$ collector region 20 does not contribute to latching up. When the width La of recessed part 31 is large, the area not contributing to latch up increases and the hole concentration decreases along the position C to D in FIG. 6(e). Since the average hole concentration decreases over the whole device, the ON-state voltage increases. Conversely, when the width La of the recessed part 31 decreases in the condition of a constant width Lb of protruding part 32, hole concentration at protruding part 32 increases. Thus, the average hole concentration increases over the whole device and the ON-state voltage decreases.

In a conventional RC-IGBT structure without the step in the rear surface side, when the pn junction around p$^+$ collector region 20 latches up, holes are injected and go towards the surface side (emitter region side). Accordingly, if the width of p$^+$ collector region 20 is increased from 1 μm to 10 μm, the holes distribute in the width (lateral) direction at approximately constant concentration, reducing the ON-state voltage. However, the increase of the width of p$^+$ collector region 20 does not enhance the concentration of the holes. Therefore, the reduction of the ON-state voltage has its limitation.

As shown in FIG. 2, when the height D of the step, which is a depth of the recessed part, between p$^+$ collector region 20 and n$^+$ cathode region 21 is 5 μm or larger in the case of the width La of the recessed part of 1 μm, the ON-state voltage is adequately low and favorable. When the height D of the step, which is a depth of the recessed part, is large, the holes injected from p$^+$ collector region 20 to protruding part 32 accumulate in large amounts. This accumulation is dramatically enhanced when the depth D becomes 5 μm or more. The accumulation of holes depends on the ratio of the depth D to the recessed part width La. For a certain value of the recessed part width La, with increase of the depth D of the recessed part, which is a height of the protruding part, from the value of the La, the total amount of holes accumulated in the protruding part increases. When the depth D is larger than five times the width La in particular, the total amount of accumulated holes is sufficiently large and the ON-state voltage is reduced greatly. Therefore, the depth D (or height D) with respect to the width La preferably holds a relationship D≧5 La.

Figure 3:
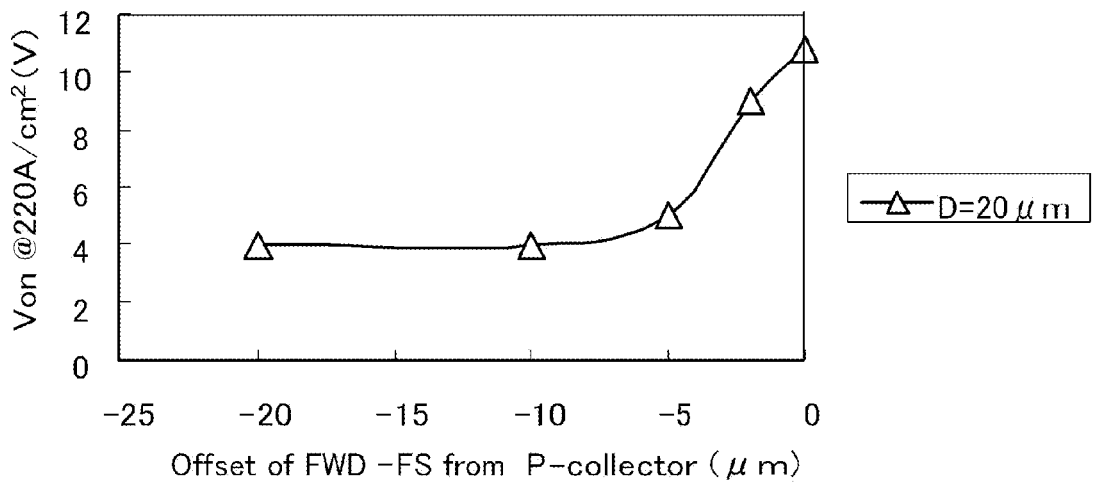
FIG. 3 shows a relationship between the ON-state voltage and the distance (offset) of the n$^+$ FS region in the FWD region from the p$^+$ collector region in an RC-IGBT of the present invention.

FIG. 3 is a graph showing variation of ON-state voltage in a dependence on a position of second n$^+$ FS region 33b that is formed near n$^+$ cathode region 21 on protruding part 32, in a specific case of the depth, which is a height difference of the step between recessed part 31 and protruding part 32, of 20 μm. Here, the distance Xoff, an offset distance, is a distance of second n$^+$ FS region 33b from the same position as the position of p$^+$ collector region 20 at the bottom of recessed part 31 towards the surface of n$^+$ cathode region 21 of protruding part 32. The arrow of "offset Xoff" shown in FIG. 1(a) indicates the direction of this distance. A graph illustrating the ON-state voltage versus this offset distance Xoff is shown in FIG. 3. The basic position (Xoff=0) is taken at the position of the second n$^+$ FS region formed at the position of p$^+$ collector region 20. The Xoff takes a negative value with downward shift of the position of second n$^+$ FS region 33b towards the surface of protruding part 32. At Xoff=−20 μm, second n$^+$ FS region 33b in protruding part 32 is nearest to n$^+$ cathode region 21. In this special case of FIG. 3, both the width Lb of the protruding part and the width La of the recessed part are 1 μm. The ON-state voltage Von is the highest at the offset Xoff=0. At this position of second n$^+$ FS region 33b, the electrons injected from the MOS gate are "trapped" by second n$^+$ FS region 33b, which has a lower resistivity than that of n$^-$ drift layer 9. As a consequence, a voltage drop that exceeds the built-in voltage of the pn junction is not generated and a latching up phenomenon hardly occurs. The ON-state voltage starts to exhibit abrupt drop at the offset Xoff of 2 μm and reaches about 4 V, which is the minimum value, at the offset Xoff of about 10 μm, which corresponds to the middle position in protruding part 32. Thus, second n$^+$ FS region 33b is sufficiently formed within protruding part 32 and preferably formed at a position of the offset Xoff (absolute value) larger than half height of the step between recessed part 31 and protruding part 32.

Figure 4:
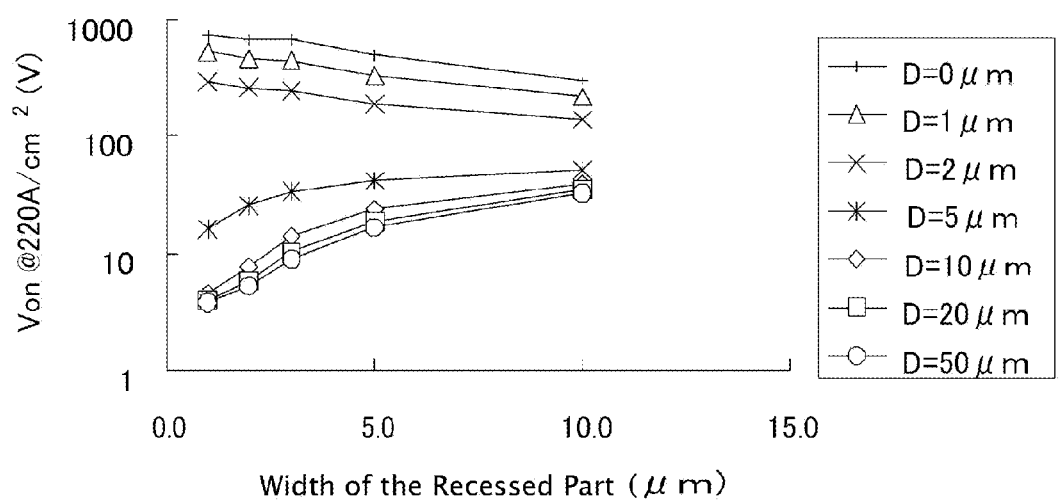
FIG. 4 shows a relationship between the ON-state voltage and the width of the recessed parts of the steps formed in the rear surface side when the n$^+$ FS region of the IGBT region is adjacent to the p$^+$ collector region and the n$^+$ FS region of the FWD region is adjacent to the n$^+$ cathode region.

FIG. 4 shows ON-state voltages when first n$^+$ FS region 33a is disposed adjacent to p$^+$ collector region 20 and second n$^+$ FS region 33b is disposed adjacent to n$^+$ cathode region 21. The dependency in FIG. 4 is similar to the one in FIG. 2. ON-state voltages in the cases of the step height of 2 μm and smaller are higher than those in FIG. 2. In the cases of 5 μm and larger, the ON-state voltage decreases and in the cases of 10 μm and larger, the ON-state voltages are approximately the same values in the range of the width La of the recessed part of 3 μm or smaller. Thus, the structure provided with the steps according to the invention exhibits a low ON-state voltage irrespective of the positions of first and second n$^+$ FS regions 33a and 33b. The reason for this is because the latching up point is shifted, as described previously, from the junction surface of p$^+$ collector region 20 towards protruding part 32 apart from first n+FS region 33a, thereby influence of the n$^+$ FS region is eliminated. As a consequence, an RC-IGBT is possible having a structure with first n$^+$ FS region 33a disposed adjacent to p$^+$ collector region 20 and second n$^+$ FS region 33b excluded.

FIG. 5 shows variation of the ON-state voltage when the ratio of the width La of the recessed part to the cell pitch is varied, the latter being fixed to 11 μm. The cell pitch here is a unit length La+Lb of the periodic structure consisting of the protruding part with a width Lb and the recessed part with a width La. The step height is 20 μm in the specific case of FIG. 5. For example, when the width La of the recessed part (width of the p$^+$ collector region) is 1 μm and the width Lb of the protruding part (width of the n$^+$ cathode region) is 10 μm, the ratio value is 0.09; when the width La of the recessed part (width of the p$^+$ collector region) is 10 μm and the width Lb of the protruding part (width of the n$^+$ cathode region) is 1 μm, the ratio value is 0.9. ON-state voltage is highest at the ratio value of 0.9 in the range in FIG. 5. When this ratio value decreases to about 0.7, the ON-state voltage drops rapidly. In the range of the ratio of smaller than about 0.6, the speed of ON-state voltage reduction slows down and in the range of the ratio of smaller than about 0.2, the ON-state voltage decreases rather rapidly again. Consequently, the ratio is preferably in the range not larger than 0.7, and more preferably, in the range not larger than 0.2 where ON-state voltage further decreases. The second reason for reduction of ON-state voltage described previously can be attributed to the fact shown in FIG. 5 that the ON-state voltage is reduced accompanying decrease of the ratio of the recess portion width to the cell pitch.

The present invention when applied to for example, converter-inverter circuit, allows controlling induction motors and servo motors with high efficiency. In addition, the equipment itself can be reduced in its size.

As described thus far, a construction is not necessary in which principal active regions for an IGBT region and for an FWD region are individually provided and arranged dividing the front surface side into two areas as in the conventional technology. According to the invention, a common MOS gate structure can be formed for both the IGBT region and the FWD region on almost whole surface over the active region, and IGBT operation and the FWD operation can be performed with little loss over the whole surface. In the case the elemental devices of IGBT and FWD are separately manufactured and housed in a casing assembling an IGBT module, the FWD region is constructed in a relative area of typically from 0.5 to 0.7 with respect to an area for the IGBT region of 1, summing up to a total necessary area of 1.5 to 1.7. If the IGBT and FWD are integrated into a single chip according to the conventional technologies, a necessary area is still in the range of 1.2 to 1.5. According to the present invention, however, a necessary area can remain at 1.0. Moreover, the area can be further reduced by optimizing the step and impurity concentration of the $p^+$ collector region and the $n^+$ cathode region on the rear surface side. As a result, a chip area can be reduced to 58% to 68% of an existing IGBT module. Consequently, a cost of a module itself can be reduced to at least 70% or less. Therefore, such IGBTs are realized that generate significantly reduced electrical loss as compared with existing products. In addition, the present invention leads to provision of IGBT modules, IPMs, and equipment employing these devices that generate little electric losses and are conscious of environmental issues.

Thus, a reverse-conducting insulated gate bipolar transistor has been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

This application is based on, and claims priority to, Japanese Patent Application No. 2010-017681, filed on Jan. 29, 2010. The disclosure of the priority application in its entirety, including the drawings, claims, and the specification thereof, is incorporated herein by reference.

Description of Symbols
- 9: n-drift layer
- 10: p base layer
- 11: trench
- 12: gate oxide film
- 13: gate electrode
- 14: $n^+$ emitter region
- 15: emitter electrode
- 16: $p^+$ contact region
- 17: interlayer dielectric film
- 20: $p^+$ collector region
- 21: $n^+$ cathode region
- 30: MOS gate structure
- 31: recessed part
- 32: protruding part
- 33a: first $n^+$ FS region
- 33b: second $n^+$ FS region
- 34: insulation film
- 35: collector electrode
- 40: IGBT region
- 50: FWD region
- 100: RC-IGBT

What is claimed is:

1. A reverse-conducting insulated gate bipolar transistor comprising:
   a MOS gate structure on a first major surface of a first conductivity type semiconductor substrate, the MOS gate structure including,
   a second conductivity type base region,
   a first conductivity type emitter region selectively formed in the surface region of the second conductivity type base region, and
   a gate electrode disposed, via an insulation film, on a surface of the second conductivity type base region at a place between a surface of the emitter region and the first major surface of the first conductivity type semiconductor substrate; and
   a rear surface side structure in a second major surface side of the semiconductor substrate, the rear surface side structure including,
   a plurality of recessed parts in a vertical direction, the recessed parts being repeated periodically along the second major surface, a depth D of each of the recessed parts being greater than 5 μm,
   a plurality of protruding parts interposed between the recessed parts,
   a second conductivity type collector region on a bottom surface of each of the recessed parts,
   a first field stop region of a first conductivity type positioned above and in line with each collector region and being at a position deeper than the collector region, each first field stop region being separated from the collector region and from other first field stop regions,
   a first conductivity type cathode region on a top surface of the protruding part, and
   a first conductivity type second field stop region in the protruding part at a position deeper than the cathode region and shallower than the collector region.

2. The reverse-conducting insulated gate bipolar transistor according to claim 1, wherein the MOS gate structure comprises a trench extending vertically from a surface of the emitter region and passing through the second conductivity type base region, and the gate electrode is embedded in the trench along the base region within the insulation film.

3. The reverse-conducting insulated gate bipolar transistor according to claim 2, wherein the depth D of the protruding part and a width La of the recessed part satisfies a relationship $D \geq 5 La$.

4. The reverse-conducting insulated gate bipolar transistor according to claim 2, wherein a position of the maximum net doping concentration of the second field stop region is formed within the protruding part.

5. The reverse-conducting insulated gate bipolar transistor according to claim 2, wherein a ratio of a width of the recessed part to a sum of the width of the recessed part and a width of the protruding part is not larger than 0.7.

6. The reverse-conducting insulated gate bipolar transistor according to claim 2, wherein a pitch of a set of one protruding part and one recessed part of the step is not larger than 5 μm.

7. The reverse-conducting insulated gate bipolar transistor according to claim 2, wherein a ratio of a width of the recessed part to a sum of the width of the recessed part and a width of the protruding part is not larger than 0.2.

8. The reverse-conducting insulated gate bipolar transistor according to claim 1, wherein the offset distance Xoff between the second FS region and the collector region is greater than or equal to 5 μm.

9. The reverse-conducting insulated gate bipolar transistor according to claim 1, wherein the width of each of the recessed parts is less than or equal to 5 μm.

10. A reverse-conducting insulated gate bipolar transistor comprising:
    a MOS gate structure on a first major surface of a first conductivity type semiconductor substrate, the MOS gate structure including,
    a second conductivity type base region,
    a first conductivity type emitter region selectively formed in the surface region of the second conductivity type base region, and a gate electrode disposed, via an insulation film, on a surface of the second conductivity type base region at a place between a surface of the emitter region and the first major surface of the first conductivity type semiconductor substrate; and
a rear surface side structure in a second major surface side of the semiconductor substrate, the rear surface side structure including,
a plurality of recessed parts in a vertical direction, the recessed parts being repeated periodically along the second major surface, a depth D of each of the recessed parts being greater than or equal to 5 μm and the width of each of the recessed parts being less than or equal to 5 μm,
a plurality of protruding parts interposed between the recessed parts,
a second conductivity type collector region on a bottom surface of each of the recessed parts,
a first conductivity type cathode region on a top surface of the protruding part, wherein
a trench extends vertically from a surface of the emitter region and passes through the second conductivity type base region, the gate electrode being embedded in the trench along the base region within the insulation film,
a height D of the protruding part and a width La of the recessed part satisfies a relationship $D \geqq 5\,La$,
a ratio of a width of the recessed part to a sum of the width of the recessed part and a width of the protruding part is not larger than 0.7,
a pitch of a set of one protruding part and one recessed part of the step is not larger than 5 μm, and
a ratio of a width of the recessed part to a sum of the width of the recessed part and a width of the protruding part is not larger than 0.2.

* * * * *